(12) United States Patent
Sandford et al.

(10) Patent No.: US 7,675,223 B2
(45) Date of Patent: Mar. 9, 2010

(54) CLIP

(75) Inventors: Guy C. Sandford, Battle (GB); Karl W. Graham, Ballymena (GB)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 12/080,518

(22) Filed: Apr. 3, 2008

(65) Prior Publication Data

US 2008/0246369 A1    Oct. 9, 2008

(30) Foreign Application Priority Data

Apr. 5, 2007    (EP)    .................................. 07251514

(51) Int. Cl.
*H03H 9/05*    (2006.01)
(52) U.S. Cl. ........................... 310/348; 24/22; 24/23 R; 24/20 S
(58) Field of Classification Search ................. 310/348, 310/325; 24/22, 20 S, 23 R, 16 R
See application file for complete search history.

(56) References Cited

U.S. PATENT DOCUMENTS

| | | | | |
|---|---|---|---|---|
| 4,322,975 A | * | 4/1982 | Schmidt et al. ............... 73/633 |
| 4,335,490 A | * | 6/1982 | Teachout .................... 24/114.5 |
| 5,115,541 A | * | 5/1992 | Stichel ........................ 24/20 R |
| 5,448,846 A | * | 9/1995 | Peterson et al. ............... 40/633 |
| 6,282,757 B1 | * | 9/2001 | Buck ........................ 24/30.5 R |
| 6,763,554 B1 | * | 7/2004 | Torrey et al. ............... 24/30.5 P |
| 2007/0069043 A1 | * | 3/2007 | Bogner ..................... 239/102.2 |
| 2007/0103030 A1 | * | 5/2007 | Bosch et al. ................. 310/311 |

\* cited by examiner

*Primary Examiner*—Walter Benson
*Assistant Examiner*—Bryan P Gordon
(74) *Attorney, Agent, or Firm*—Thomas N. Twomey

(57) ABSTRACT

A clip for securing a sleeve to the body of a piezoelectric actuator in an actuator assembly. The clip takes the form of a band and has at least a first and a second stable state. The minimum separation of the walls of the band when the clip is in one of the stable states is less than the minimum separation of the walls of the band when the clip is in an unstable state. The clip is forced into an unstable state in order to be fitted over the sleeve of the actuator assembly. The force is then removed to allow the clip to revert towards a stable state. The dimensions of the clip are such that the clip is unable to fully revert to a stable state when fitted to the actuator assembly thereby maintaining sufficient additional strain energy to maintain a sufficient clamping force between the sleeve and the body of the actuator.

15 Claims, 3 Drawing Sheets

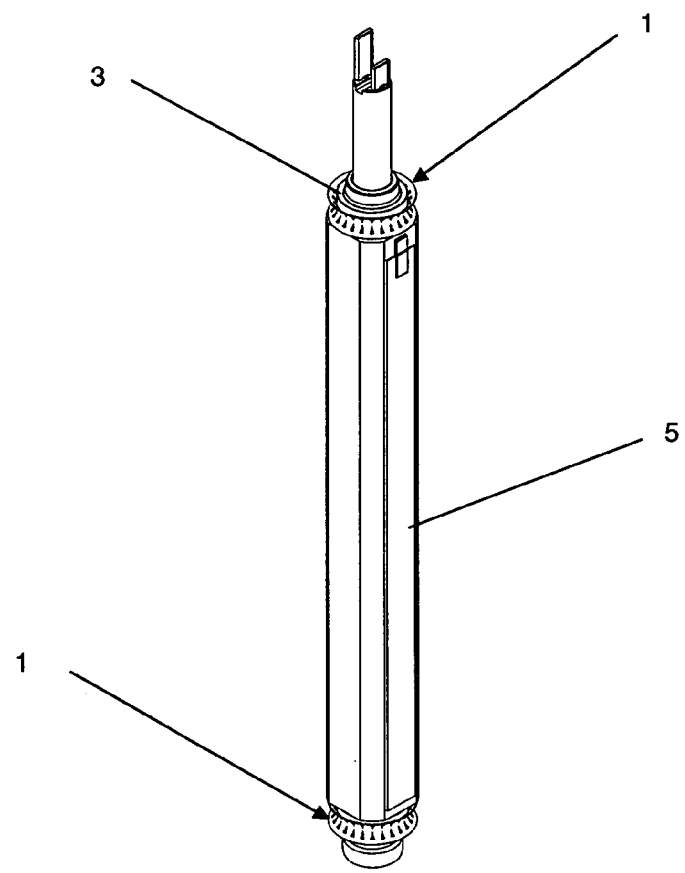
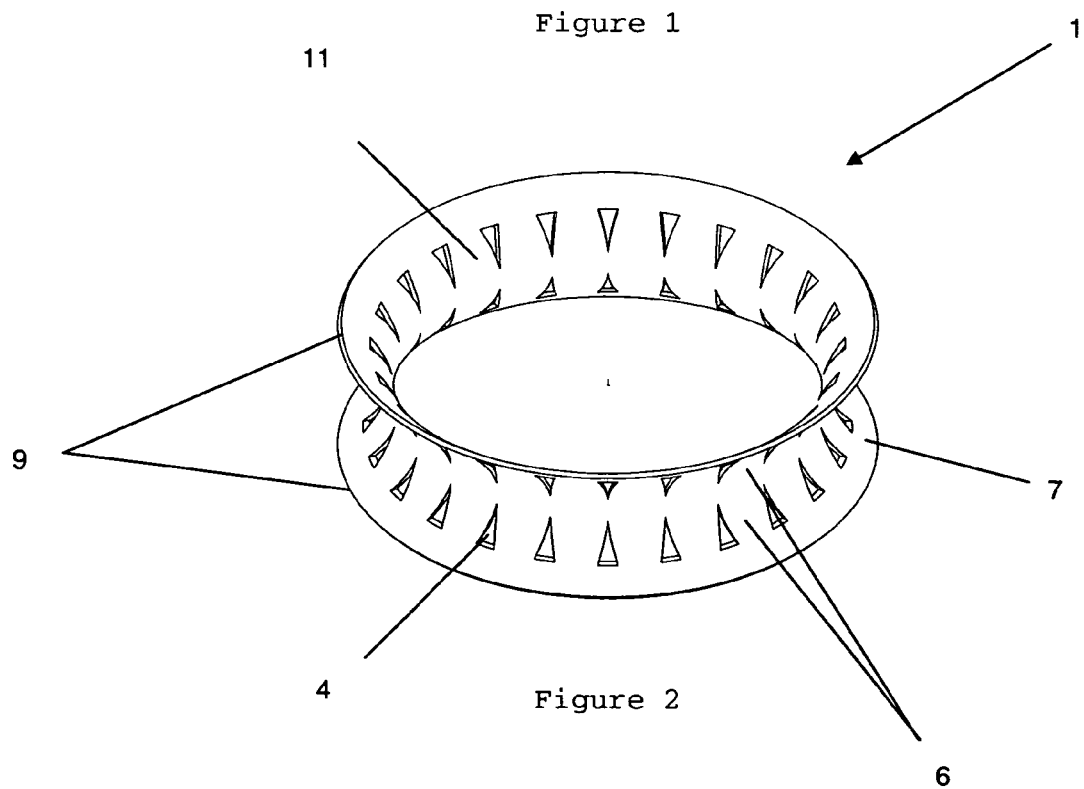
Figure 1
Figure 2

CLIP

TECHNICAL FIELD

The present invention relates to a clip for sealing the ends of a sleeve located around a piezoelectric actuator to the body of that piezoelectric actuator. In particular, the present invention relates to a bistable clip.

BACKGROUND OF THE INVENTION

In a fuel injector the piezoelectric actuator may be located in an accumulator volume which receives high pressure fuel. It is essential to prevent contact between the fuel and the actuator to prevent the actuator from suffering damage. To prevent such damage it is known to provide a sleeve around the actuator. This sleeve must be sealed to the actuator at each end to prevent the ingress of fuel and any contaminants that it may contain.

SUMMARY OF THE INVENTION

According to a first aspect, the present invention provides a clip for securing a sleeve to the body of a piezoelectric actuator in an actuator assembly, the clip taking the form of a band having at least two stable states wherein in each stable state the minimum distance of separation of the internal surfaces of the band walls is less than the minimum distance of separation of the internal surfaces of the band walls when the clip is in an unstable state.

In either of the at least two stable states the clip may be used to clamp the sleeve of an actuator assembly, typically an assembly incorporating a piezoelectric actuator, to the body of the actuator. The clip must be placed in an unstable state, by application of a force, for fitment to the actuator assembly.

Preferably the clip is circular. This is advantageous because the distribution of stress and force is mathematically uniform in the radial plane and thus provides a continuous and uniform radial sealing force. However, the band may be of any shape that is necessary to complement the external profile of the actuator body. For example, the band may be hexagonal.

Preferably, the upper edges of the band walls are located within a first radial plane and the lower edges of the band walls are located within a second radial plane and the first and second radial planes are parallel. Alternatively, the upper and lower edges may not be located in single radial planes. This is advantageous because the extra degree of freedom can improve the sealing function. For example, the upper and lower edges may have a wave form. Specifically, the upper and lower edges may take the form of a hyperbolic paraboloid (Pringle®-shape). This increases the internal separation of the band walls when the clip is elastically deformed into an unstable state, for example by application of an axial force, so that the upper and lower edges of the walls are each located in single parallel radial planes. In this position the clip can be fitted over the sleeve and actuator body, wherein removal of the deforming force returns the clip to the hyperbolic paraboloid shape, thereby decreasing the internal separation of the walls and applying a clamping force to the actuator assembly.

Preferably, when the clip is in a stable state, the band walls have a 'C' shaped cross-sectional profile. However, the wall may be provided with any suitable cross-sectional profile. For example, the band may have an undulating cross-sectional profile thus providing multiple continuous ring contacts which increases the redundancy of the sealing function.

Preferably, the ends of the band walls face away from the centre of the clip when the clip is in a first stable state. In the first stable state the clip makes a single continuous ring contact with the actuator when the central region of the wall comes into contact with the sleeve located around the actuator body. The provision of a single contact region provides a compact design.

Preferably, the ends of the band walls face towards the centre of the clip when the clip is in a second stable state. In the second stable state the clip makes two continuous ring contacts with the actuator when the end regions of the band walls come into contact with the sleeve. The provision of two contact regions increases the redundancy of the sealing function by providing two continuous ring contacts.

In an alternative embodiment, the clip may have three or more stable states. For example, the clip may have an S-shaped cross-sectional profile in a first stable state, a C-shaped cross-sectional profile in a second stable state and a mirror-image of that C-shaped cross-sectional profile in a third stable state. This increases the redundancy of the sealing function by providing a plurality of continuous ring contacts.

In the preferred embodiment, the thickness of the band walls may be constant throughout their height. This is advantageous because the component is easier to make than one where the wall thickness varies. Alternatively, the thickness of the wall may vary between the ends of the wall. This allows for the stress distribution to be tailored to the application that the clip is used for, such that it is favourably improved. This may increase the operating range, i.e. the range of external diameters of the sleeve when fitted to the actuator body across which a sufficient clamping force can be maintained for the life of the actuator, the clamping force, the durability and the ease of fitment of the clip, or a combination of any of these factors.

In the preferred embodiment, the distance between the ends of the band walls, along the surface of the walls, may be constant. The clip is thus easy to manufacture and fit. However, the distance may vary if this is necessary for the clip to fit to a particular application.

Preferably, the band walls are provided with perforations. If the band walls are perforated the clip can be made with a greater wall thickness whilst still retaining its ability to transition between stable states. The provision of a greater wall thickness is advantageous because it allows the clip to provide a greater clamping force for a specific displacement of the wall from a stable state.

Preferably, the perforations are triangular. The tapered shape allows for stresses to be varied without sharp corners that cause stress-raisers that may limit the function of the clip.

Preferably, the perforations are arranged in two rows around the periphery of the band. This permits a favourable stress distribution.

Preferably, the corners of the perforations are provided with a radius. This reduces the stress intensity at the corners.

Preferably, the clip is made from spring steel. This is advantageous because of the large elastic range of this material. Alternatively, the clip may be made from a shape memory alloy (SMA). This is advantageous because of the increased elastic range of this family of materials.

A ring made from a polymer or other suitable material may be located between the clip and the object being clamped. The provision of a polymer ring prevents the clip from damaging the object being clamped. The ribs are preferably aligned radially but may be oriented differently. In addition, the polymer ring can be used to distribute the clamping load applied by the clip.

The internal surface of the clip may also be provided with ribs or serrations which prevent movement of the clip relative to the object being clamped. The clip may have a tendency to move due to temperature or pressure variations or creep of a material.

According to a second aspect, the present invention provides an actuator assembly comprising a clip, an actuator and a sleeve, which overlaps at least part of the body of the actuator, wherein at the location where the sleeve overlaps the body of the actuator the minimum separation of the external walls of the sleeve is greater than the minimum separation of the internal band walls of the clip, when the clip is in a stable state, such that when the clip is fitted over the sleeve the clip applies a clamping force to the sleeve in order to create a seal between the sleeve and the body of the actuator.

BRIEF DESCRIPTION OF THE DRAWINGS

A preferred embodiment of the present invention will now be described with reference to the accompanying drawings in which:

FIG. 1 is a perspective view of a piezoelectric actuator assembly provided with a protective sleeve which is sealed at either end to the body of the actuator by a bistable clip, in a first stable state, according to the preferred embodiment of the present invention;

FIG. 2 is a perspective view of the bistable clip of FIG. 1 in the first stable state;

DETAILED DESCRIPTION OF PREFERRED EMBODIMENTS

Figure 3:
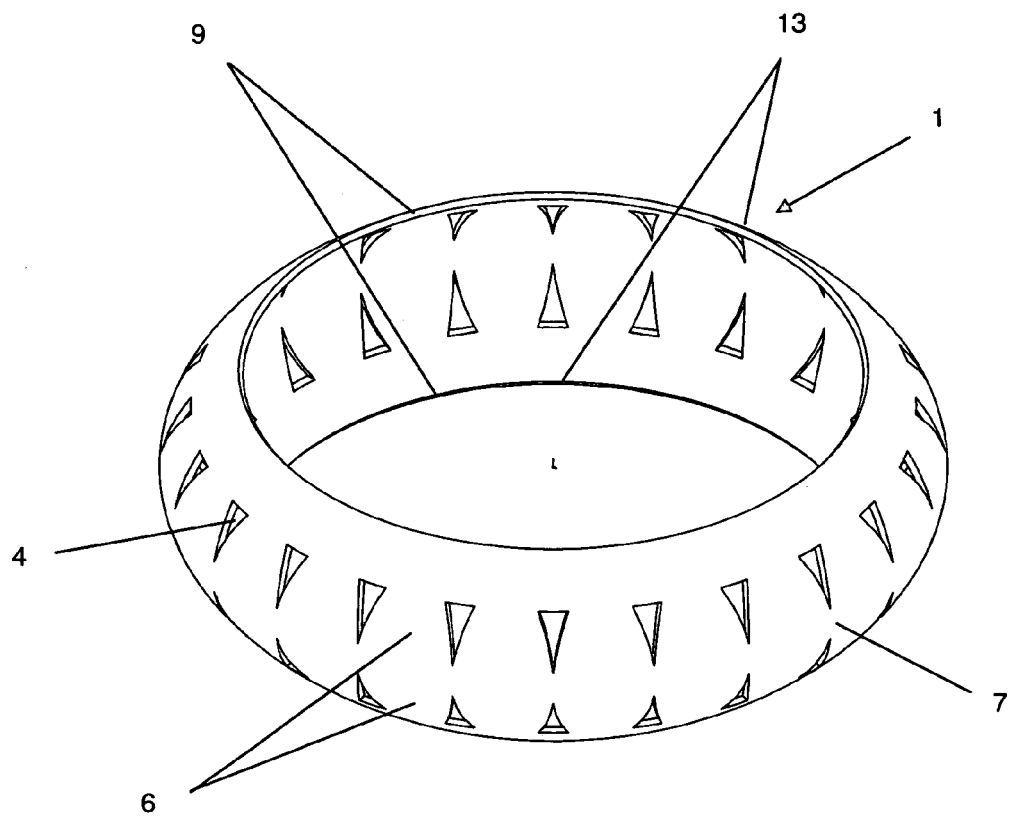
FIG. 3 is a perspective view of the bistable clip of FIG. 1 in a second stable state.

FIG. 1 illustrates an application of a bistable clip 1 according to the present invention to a piezoelectric actuator assembly. A clip 1 is located at each end of the body of an actuator 5, over a sleeve 3, in order to seal the actuator 5 within the sleeve 3.

The clip 1 is in the form of a band having a continuous circular wall 7. The wall 7 has a constant thickness and a constant height and is manufactured from spring steel. The upper and lower edges (9) of the wall (7) are each contained within a single radial plane and these two radial planes are parallel. The clip 1 can take two low strain energy stable states. In both of those states the wall 7 takes a 'C' shaped cross-sectional profile.

A first state is illustrated in FIG. 2. In this first stable state the ends 9 of the wall 7 face away from the centre of the clip 1. This creates a region 11 at the median point of the wall 7 in which separation of opposed portions of the wall is at a minimum, i.e. where the internal diameter is smallest. This region 11 forms a single continuous ring contact clamping surface when the clip 1 is applied to the actuator assembly.

A second stable state is illustrated in FIG. 3. In the second stable state the ends 9 of the wall 7 face towards the centre of the clip 1. This creates two regions 13, corresponding with the ends 9 of the wall 7, in which separation of opposed portions of the walls is at a minimum, i.e. where the internal diameter is smallest. These regions 13 form two continuous ring contact clamping surfaces when the clip 1 is applied to an actuator assembly.

Figure 5:
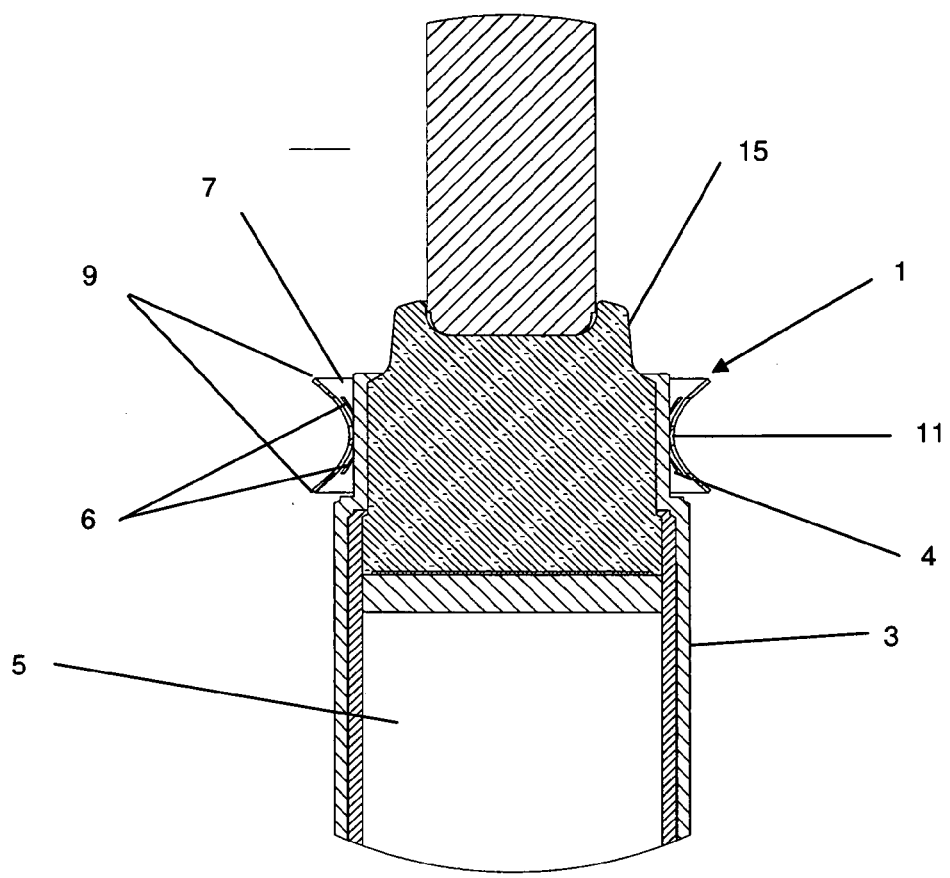
FIG. 5 is a cross-sectional view of the bistable clip of FIG. 1 in the first stable state and sealing a sleeve to a first end of a piezoelectric actuator assembly.
Figure 6:
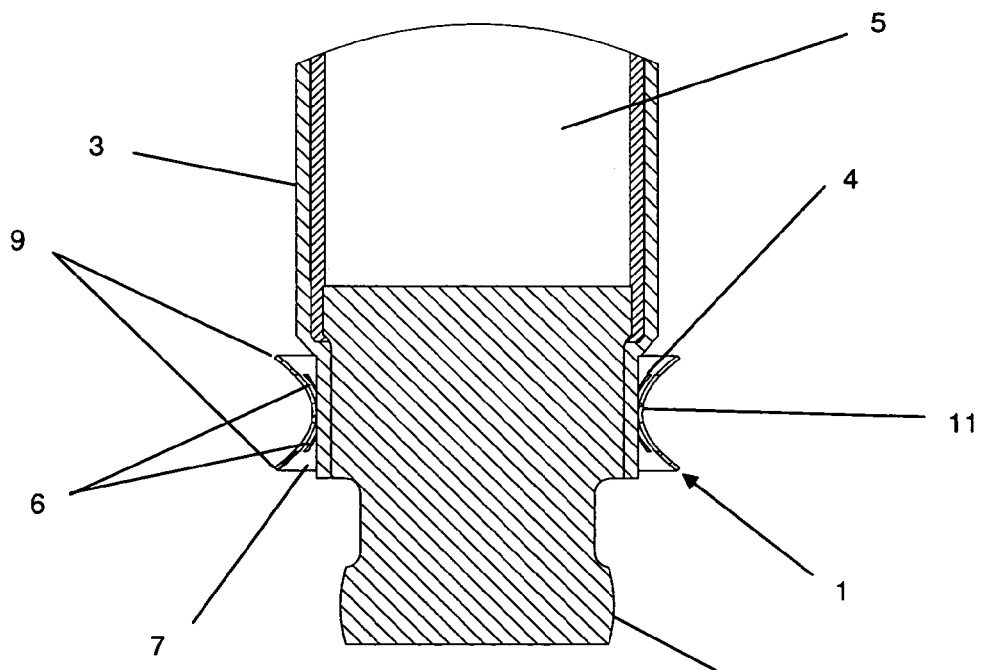
FIG. 6 is a cross-sectional view of the bistable clip of FIG. 1 in the first stable state and sealing a sleeve to a second end of the piezoelectric actuator assembly.

The clip 1 can be transitioned between these two stable states and the material from which the clip 1 is manufactured is chosen so that it remains elastic during the transition from one stable state to the other. The clip 1 rests in one of these stable states when it is applying a clamping load to an actuator assembly, as illustrated in FIGS. 1, 5 and 6.

Figure 4:
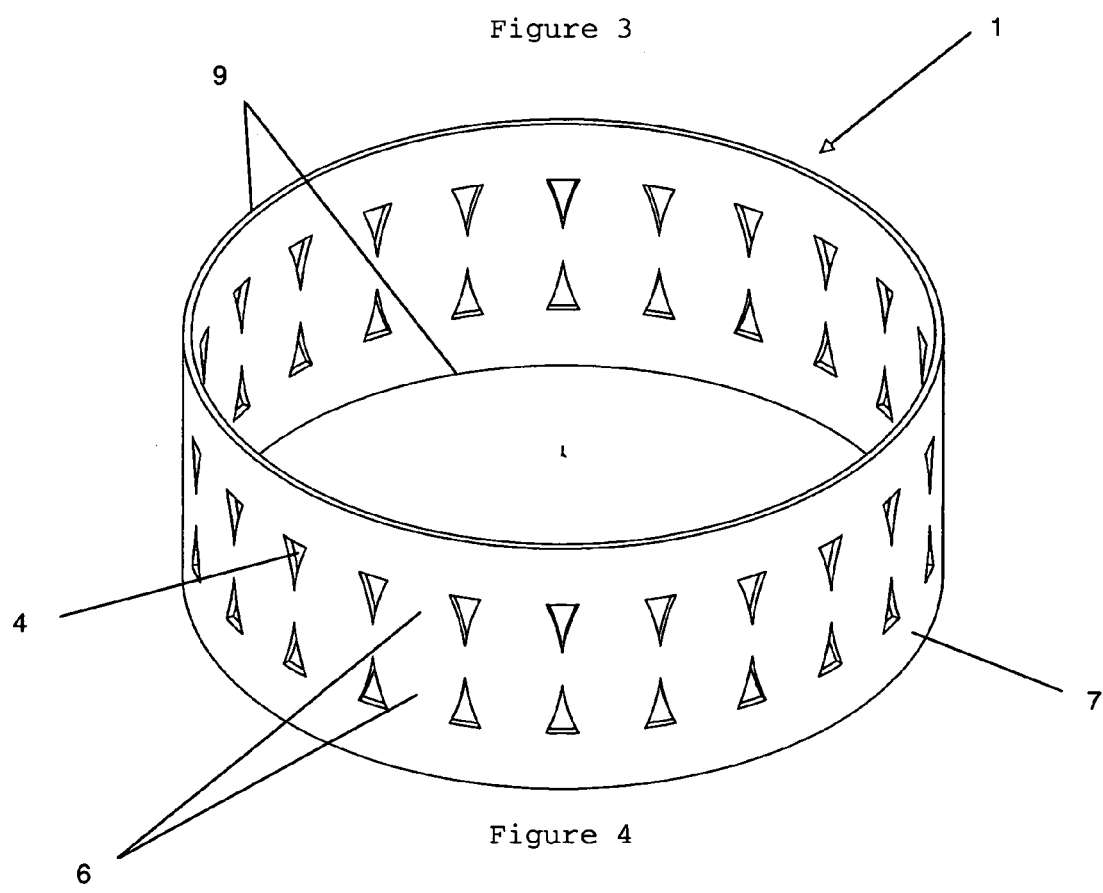
FIG. 4 is a perspective view of the bistable clip of FIG. 1 in an unstable state.

FIG. 4 shows the clip 1 in an unstable state, wherein the wall 7 of the clip 1 is cylindrical. When the wall 7 is in a cylindrical form the minimum separation of opposed portions of the wall 7, i.e. its smallest internal diameter, is greater than the minimum distance between external opposed portions of the part of the actuator assembly to which it is to be clamped, i.e. the external diameter of the sleeve 3 over the body of the actuator 5. Consequently, the clip 1 is maintained in this unstable state when it is being fitted to the actuator assembly.

The clip 1 is provided with perforations 4 which are arranged in two rows 6 around the circumference of the wall 7. The perforations are triangular in shape with the apices of one row 6 of perforations 4 facing the apices of the other row 6 of perforations 4.

The actuator assembly comprises an external sleeve 3 surrounding an actuator 5. The body of the actuator 5 is provided at each end with an end-piece 15 having a circular external cross-sectional profile. The sleeve 3 extends over the circular profile parts of the end-pieces 15. The external diameter of the sleeve 3 when located over the end-pieces 15 is greater than the diameter of the region 11 of the clip 1 when it is in its first stable state or the regions 13 of the clip 1 when it is in its second stable state.

In order to fit the clip 1 to an end piece 15 the clip 1 is forced in to an unstable state, as illustrated in FIG. 4. As the minimum internal diameter of the clip 1 is larger than the external diameter of the coated end piece 15 the clip 1 can be located over the end piece 15.

When the clip 1 has been located over the end piece 15 the force maintaining it in the unstable state is removed. The clip 1 then tries to revert to either of the first or second stable states. However, because the external diameter of the end of the sleeve 3 is greater than the internal diameter of the clip 1 the clip 1 cannot fully revert to a stable state. Instead it remains in an unstable state whereby it maintains strain energy. The clip 1 translates this strain energy into a radial clamping force which is applied to the sleeve 3 and thus to the end piece 15. This creates a seal between the sleeve 3 and the end-piece 15.

The dimensions of the clip 1 are chosen such that sufficient additional strain energy over the stable state is maintained in the clip 1 to provide a sufficient clamping force when it is located over the actuator assembly. In addition to the strain energy being of a sufficient level upon first application of the clip 1 to the actuator assembly it must maintain sufficient margin to the stable strain energy state throughout the life of the actuator assembly. For example, it must be able to maintain a sufficient clamping force if the external diameter of the sleeve around the end-piece reduces, for example as a result of creep of the material.

Typically, the diameter of the clip 1 is around 9 mm. The wall 7 typically has a constant thickness of 0.25 mm and a constant height, typically 4 mm.

The invention claimed is:

1. A clip for securing a sleeve to the body of a piezoelectric actuator in an actuator assembly, the clip taking the form of a band having at least two stable states wherein in each stable state the minimum distance of separation of the internal surfaces of the band walls is less than the minimum distance of separation of the internal surfaces of the band walls when the clip is in an unstable state.

2. A clip as claimed in claim 1, wherein the band is circular.

3. A clip as claimed in claim 1, wherein the upper edges of the band walls are located within a first radial plane and the lower edges of the band walls are located within a second radial plane and the first and second radial planes are parallel.

4. A clip as claimed in claim 1, wherein when the clip is in a stable state the band walls have a 'C' shaped cross-sectional profile.

5. A clip as claimed in claim 1, wherein the ends of the band walls face away from the centre of the clip when the clip is in a first stable state.

6. A clip as claimed in claim 1, wherein the ends of the band walls face towards the centre of the clip when the clip is in a second stable state.

7. A clip as claimed in claim 1, having three or more stable states.

8. A clip as claimed in claim 1, wherein the thickness of the band walls is constant throughout their height.

9. A clip as claimed in claim 1, wherein the distance between the ends of the band walls along the surface of the band walls is constant.

10. A clip for securing a sleeve to the body of a piezoelectric actuator in an actuator assembly, the clip taking the form of a band having at least two stable states wherein in each stable state the minimum distance of separation of the internal surfaces of the band walls is less than the minimum distance of separation of the internal surfaces of the band walls when the clip is in an unstable state, wherein the band walls are provided with perforations.

11. A clip as claimed in claim 10, wherein the perforations are triangular.

12. A clip as claimed in claim 10, wherein the perforations are arranged in two rows around the periphery of the clip.

13. A clip as claimed in claim 10, wherein the perforations are triangular, arranged in two rows around the periphery of the clip, and the apices of the triangular perforations of one row are directly opposed to the apices of the triangular perforations of the other row.

14. A clip as claimed in claim 10, wherein the corners of the perforations are provided with a radius.

15. A clip as claimed in claim 1 made from spring steel.

* * * * *